United States Patent [19]
Kumpfmiller et al.

[11] Patent Number: 6,007,967
[45] Date of Patent: Dec. 28, 1999

[54] METHODS FOR OFF-CONTACT IMAGING SOLID PRINTING PLATES

[75] Inventors: Ronald James Kumpfmiller, Marietta; David Andrew Recchia, Smyrna, both of Ga.

[73] Assignee: Polyfibron Technologies, Inc., Atlanta, Ga.

[21] Appl. No.: 08/989,213

[22] Filed: Dec. 11, 1997

[51] Int. Cl.⁶ .................... G03F 7/20; G03F 7/38
[52] U.S. Cl. ............................................. 430/306
[58] Field of Search ................................ 430/306

[56] References Cited

U.S. PATENT DOCUMENTS

| | | | |
|---|---|---|---|
| 2,760,863 | 8/1956 | Plambeck, Jr. | 430/306 |
| 3,537,853 | 11/1970 | Wessells et al. | 96/35.1 |
| 4,221,646 | 9/1980 | Finelli et al. | 204/159.19 |
| 4,702,994 | 10/1987 | Rendulic et al. | 430/306 |
| 5,418,112 | 5/1995 | Mirle et al. | 430/269 |

OTHER PUBLICATIONS

Flexography: Principles & Practices; Published by the Foundation of Flexographic Technical Associattion, Inc., Fourth Edition; pp. 412, 416–418, 424, 504, and 518, year 1991.

The Digital Difference by Bradley K. Taylor, Roxy Ni Fan and Gracieia B. Blanchet; FLEXO Jul. 1997; pp. 32, 34, 36, 39–41.

*Primary Examiner*—Cynthia Hamilton
*Attorney, Agent, or Firm*—Woodcock Washburn Kurtz Mackiewicz & Norris LLP

[57] ABSTRACT

The present invention relates to methods for off-contact imaging solid relief printing plates and, in particular, to methods for imaging solid photocurable elements through a negative, where there is a gap between the solid photocurable element and the negative. The present invention also relates to printing plates produced by these methods.

23 Claims, 4 Drawing Sheets

METHODS FOR OFF-CONTACT IMAGING SOLID PRINTING PLATES

FIELD OF THE INVENTION

The present invention relates to methods for off-contact imaging solid relief printing plates and, in particular, to methods for imaging solid photocurable elements through a negative, where there is a gap between the solid photocurable element and the negative. The present invention also relates to printing plates produced by these methods.

BACKGROUND OF THE INVENTION

Relief printing plates are used in both flexographic and letterpress processes for printing on a variety of substrates, including paper, corrugated stock, film, foil, laminates and the like. The photocurable elements that are used to make relief printing plates typically comprise a support layer, one or more layers of photocurable polymer in the form of solid sheets, and a cover sheet. The cover sheet is removed from the photocurable element, whereupon a silver halide photographic negative or some other masking device is placed directly upon the photocurable polymer. The photocurable element is then exposed through the negative to actinic radiation from multiple sources, thereby causing exposed areas of the photocurable element to harden or cure. After the uncured areas of the photocurable element are removed, the cured polymer remains as the relief printing surface of the relief printing plate.

New and improved relief printing plates and methods for making relief printing plates are needed to produce sharper printed images and, thus, reduce the printed dot gain that results from the previously used methods described above. The present invention is directed to these, as well as other, important ends.

SUMMARY OF THE INVENTION

The present invention is directed to methods for producing relief printing plates comprising providing a solid photocurable element having at least one major face; positioning an image bearing negative opposite the major face and a fixed distance therefrom; and exposing photocurable material in the solid photocurable element to actinic radiation through the image bearing negative. In preferred embodiments, such methods comprise exposing the photocurable material in the solid photocurable element to actinic radiation from a single source. The solid photocurable element can optionally comprise at least one phosphine compound.

In another aspect, the invention relates to methods for producing relief printing plates comprising imaging a layer of a solid photocurable material through an image bearing negative, wherein there is a gap between the image bearing negative and the layer of the solid photocurable material. In preferred embodiments, such methods comprise imaging the layer of the solid photocurable material with actinic radiation from a single source. The solid photocurable element can optionally comprise at least one phosphine compound.

In yet another aspect, the invention relates to relief printing plates produced by the methods described above.

These and other aspects of the present invention will become apparent from the following detailed description.

DETAILED DESCRIPTION OF THE INVENTION

The present invention relates to methods of reducing the printed dot gain of solid relief printing plates. Dot gain, a known problem in the art, is an increase in ink on a substrate resulting from the process of transferring an image from a negative to a printing plate and then using the printing plate to print on the substrate. Many methods of preparing printing plates result in the formation of flat-topped cones on the printing plates. The tops of these cones typically correspond to a dot size equal to or larger than the original negative, and result in the production of a larger dot upon printing. On the other hand, the methods of the present invention result in the formation of cylinders on the printing plates, which have a diameter similar in size to dots in the original negative and result in a comparable size dot upon printing.

Figure 1:
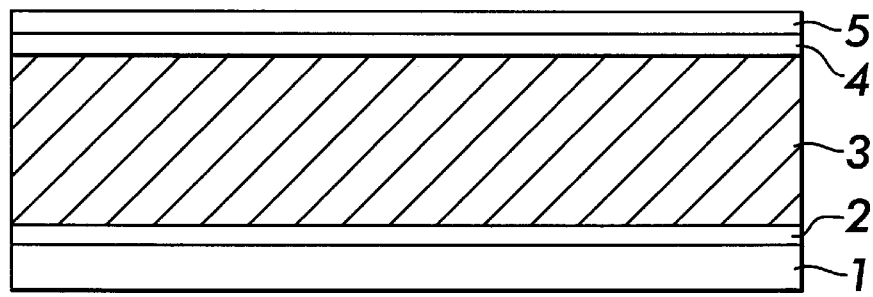
FIG. 1 is a cross-sectional illustration of a flexographic printing plate.

There are a wide variety of photocurable elements that can be used in accordance with the present invention. The photocurable elements are solid and can vary in thickness from about 0.010 inches to about 0.35 inches, preferably about 0.025 inches to about 0.25 inches, and have major faces with lengths and/or widths up to about 60 inches to about 110 inches, preferably about 52 inches to about 80 inches. Solid photocurable elements can exist as cylinders or rectilinear sheets. As shown in FIG. 1, a photocurable element can comprise a support sheet 1, one or more photocurable layer(s) 3, and a protective cover sheet 5. The photocurable element can optionally comprise a slip film 4 disposed between the protective cover sheet 5 and the photocurable layer(s) 3.

The support sheet, or backing layer, 1 can be formed from a transparent or opaque material such as paper, cellulose film, plastic, or metal. In preferred embodiments, the support sheet is a polyethylene terephthalate film having a thickness of about 0.005 inches. The support sheet 1 can optionally comprise an adhesive layer 2 for more secure attachment to the photocurable layer(s) 3.

The photocurable layer 3, which generally has a thickness of from about 0.020 to about 0.35 inches, can include a variety of known photocurable materials, such as photopolymers, initiators, reactive diluents, fillers, and dyes. Preferred photocurable materials include an elastomer compound, an ethylenically unsaturated compound having at least one terminal ethylenic group, and a photoinitiator. If a second, third or fourth photocurable layer is used, they are typically disposed upon the first and are typically similar in composition to the first, but considerably thinner, usually less than about 0.01 inches thick. Exemplary photocurable materials are described in European Patent Application Nos. 0 456 336 A2 (Goss, et al.) and 0 640 878 A1 (Goss, et al.), British Patent No. 1,366,769, and U.S. Pat. Nos. 5,223,375 (Berrier, et al.), U.S. Pat. No. 3,867,153 (MacLahan), U.S. Pat. No. 4,264,705 (Allen), U.S. Pat. No. 4,265,986 (Allen), U.S. Pat. No. 4,323,636 (Chen, et al.), U.S. Pat. No. 4,323,637 (Chen, et al.), U.S. Pat. No. 4,369,246 (Chen, et al.), U.S. Pat. No. 4,423,135 (Chen, et al.), U.S. Pat. No. 3,265,765 (Holden, et al.), U.S. Pat. No. 4,320,188 (Heinz, et al.), U.S. Pat. No. 4,427,759 (Gruetzmacher, et al.), U.S. Pat. No. 4,460,675 (Gruetzmacher, et al.), U.S. Pat. No. 4,622,088 (Min), and U.S. Pat. No. 5,135,827 (Bohm, et al.), the disclosures of which are incorporated herein by reference.

The photocurable materials of the invention should crosslink (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm.

The slip film 4, sometimes referred to as a protective layer, is disposed upon the photocurable layer(s) 3 and is typically from about 0.001 to about 0.01 inches thick. The slip film 4 generally protects the plate from contamination, increases ease of handling, and acts as an ink-accepting layer. In preferred embodiments of the invention, a slip film 4 is not present on the photocurable element during imaging.

The protective cover sheet 5 can be formed from plastic or any other removable material that can protect the plate or photocurable element from damage until it is ready for use.

Representative photocurable elements that can be used in the invention include EPIC®, SPLASH® and ATLAS® brand flexographic printing plates (commercially available from Polyfibron Technologies, Inc., Atlanta, Ga.).

The photocurable layer(s) can also comprise an oxygen scavenger, including those described by Mirle and Kumpfmiller in U.S. Pat. No. 5,418,112, the disclosure of which is incorporated herein by reference. The oxygen scavenger can be added to the printing plate by methods known in the art. Suitable oxygen scavengers include phosphine compounds having the general formula $PR_1R_2R_3$, where $R_1$, $R_2$ and $R_3$ are independently aliphatic, cycloaliphatic, aromatic, araliphatic or heterocyclic radicals, provided that at least one of $R_1$, $R_2$ and $R_3$ is an aromatic radical. Suitable phosphine compounds of the above formula include, for example, triphenylphosphine, tri-ptolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, diallyl-p-methoxyphenylphosphine, diallyl-p-bromophenylphosphine and diallyl-p-tolylphosphine. Triphenylphosphine is particularly preferred. The oxygen scavenger can be compounded into the photocurable element in an amount of about 0.1 to about 5.0 weight percent, preferably about 0.2 to about 3.0 weight percent, more preferably from about 0.5 to about 2.5 weight percent, based on the total weight of unsaturated resin in the photocurable layer(s).

Figure 2:
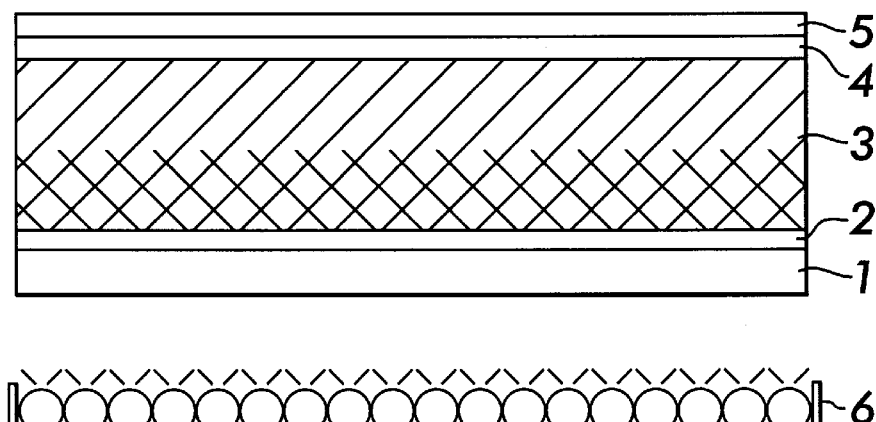
FIG. 2 is a cross-sectional illustration of the preparation of a floor in a photocurable material using multi-source actinic radiation.
Figure 3:
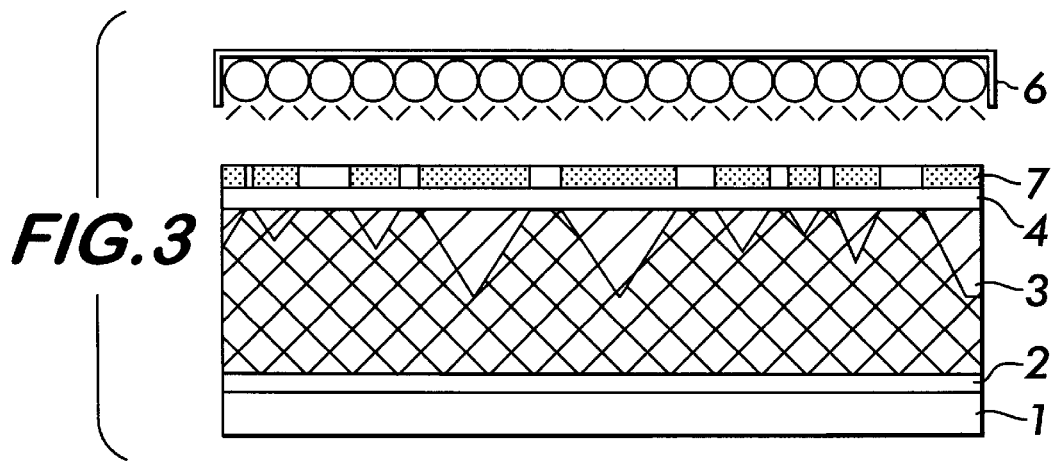
FIG. 3 is a cross-sectional illustration of an image bearing negative in direct contact with a photocurable material that is being exposed to multi-source actinic radiation.
Figure 4:
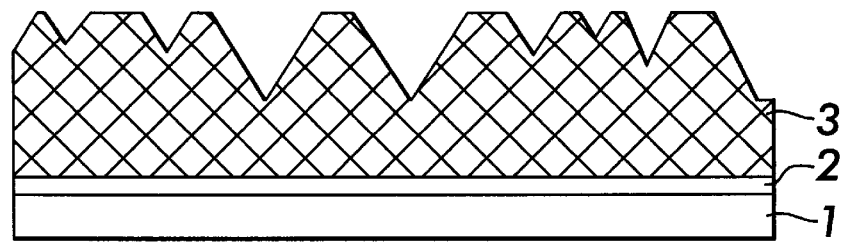
FIG. 4 is a cross-sectional illustration of a printing plate prepared by a direct contact with a negative using multi-source actinic radiation.

Representative direct contact methods for preparing printing plates from solid photocurable elements are depicted in FIGS. 2–4.

As shown in FIG. 2, a floor is prepared by photocuring the lower portion of the photocurable layer 3 with multi-source actinic radiation 6, through the support sheet 1 and the adhesive layer 2. This can be referred to as "back" exposure. For example, the floor can be prepared using a FLEXLIGHT® processing system (Polyfibron Technologies, Inc.) equipped with Dupont Hot LAmps® (DuPont Co., Wilmington, Del.) as a UV light source, which are capable of producing 18 to 24 $mW/cm^2$ of actinic radiation in the 300 nm to 400 nm range. The exposure time can be about 6 seconds to about 480 seconds.

As shown in FIG. 3, the protective cover film 5 is removed, and an image bearing negative 7 is placed in direct contact with the slip film 4. A vacuum is typically applied to insure intimate contact between the image bearing negative 7 and the slip film 4. Imaging of the printing area is achieved by exposing the photocurable layer 3 of the photocurable element with multi-source actinic radiation 6 through the transparent regions of the image bearing negative 7 for a time and under conditions effective to cure the photocurable layer 3.

Thereafter, the image bearing negative 7 is removed from the slip film 4, and the printing element is washed with a solvent system and brushing action, which solvates and removes the slip film 4 and the uncured areas of the photocurable layer 3, which leaves behind the cured polymer as the surface of the relief printing plate, as shown in FIG. 4. This imaging technique typically produces a relief printing plate that has conic shaped dots with a flat top on the dot.

Generally, the printing element is washed with (and/or in) an organic and/or aqueous solvent in which the photocurable material is at least somewhat soluble. This solvent wash step is generally accompanied, preceded, or followed by brushing, wiping, or some other mild, non-destructive abrasion of the plate. Useful plate washing devices include those commercially available from Polyfibron Technologies and Anderson & Vreeland (Bryan, Ohio).

The present invention is directed to the unexpected discovery that the shape of that portion of a printing plate which produces a printed dot becomes cylindrical (which is more desirable) by imaging the solid photocurable element through an image bearing negative that is not in direct contact with the photocurable element. The invention is further enhanced by imaging the photocurable element with a single source of actinic radiation. The resulting cylindrical shape produced by the methods of the present invention gives rise to a significant reduction in printed dot gain compared to direct contact methods. The production of the relief printing plate of the invention is depicted in FIGS. 5 and 6.

Figure 5:
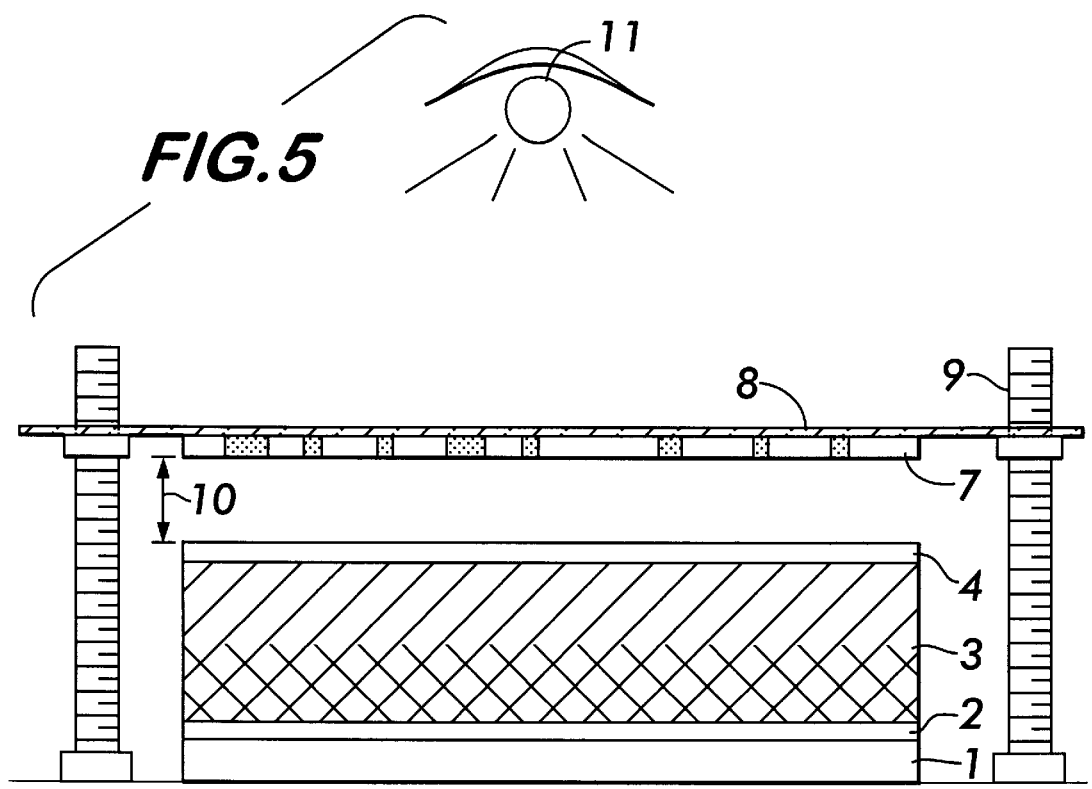
FIG. 5 is a cross-sectional illustration of the preparation of a printing plate of the present invention where a first major face of a solid photocurable element is separated from an image bearing negative by a gap and where a single source of actinic radiation is used for imaging.
Figure 6:
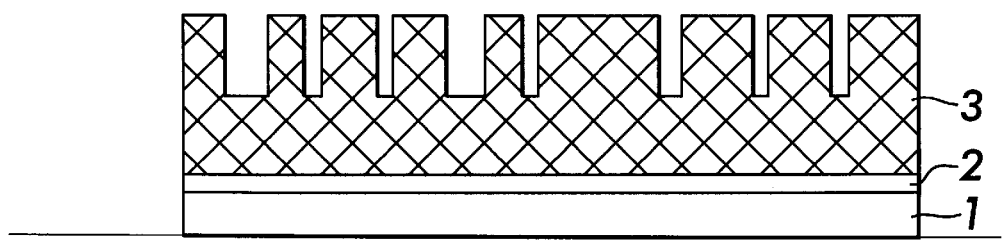
FIG. 6 is a cross-sectional illustration of a printing plate prepared by the methods of the present invention.

As shown in FIG. 5, the solid photocurable element, having a developed floor, can be placed on the imaging plate of a LETTERFLEX® 135A exposure unit (Polyfibron Technologies, Inc.). A vacuum of about 5 to about 20 inches of mercury can be applied to the support sheet 1 to keep the solid photocurable element in place on the imaging plate of the LETTERFLEX® 135A exposure unit (Polyfibron Technologies, Inc.). Thereafter, the protective cover sheet 5 is removed, thereby exposing a major face of the element.

An image bearing negative 7 can be mounted onto a glass plate 8 at a vacuum of about 5 to about 20 inches of mercury. The negative can be mounted on either side of the glass plate, preferably on the side closest to the photocurable element, as shown in FIG. 5. The image bearing negative can be a silver halide photographic negative or some other masking device. Alternatively, an image bearing positive can be used. The glass plate, sometimes referred to as copy glass, can be made of PYREX® or other transparent materials.

The glass plate 8 is lowered over the solid photocurable element, where adjustment feet 9 on the glass plate 8 suspend the image bearing negative 7 above or opposite the photocurable element to create a gap 10 between the image bearing negative and the photocurable element. In other words, the negative is opposite a major face of the photocurable element and is a fixed distance from the photocurable element, where the fixed distance is greater than zero inches. Thus, the image bearing negative is not in direct contact with the photocurable element.

The gap 10 is the fixed distance or area between the image bearing negative and the photocurable element. Generally, the area between the image bearing negative and the photocurable element comprises air at room temperature (e.g., about 23° C.) and room pressure (e.g., about 1 atmosphere), although other embodiments are possible, such as the use of an inert gas or vacuum, varying temperatures and/or varying atmospheric pressures. The gap or fixed distance between the image bearing negative and the photocurable element is about 0.0005 inches to about 0.0025 inches, preferably about 0.0010 inches to about 0.0020 inches, more preferably about 0.0012 inches to about 0.0016 inches, most preferably about 0.0014 inches. Due to the presence of the gap, the present methods can be referred to as off-contact methods, because the image bearing negative is not in contact with or does not touch the photocurable element. In direct contact methods, the image bearing negative is in direct contact with the photocurable element, such that there is no gap between the image bearing negative and the photocurable element.

The light source 11 in the LETTERFLEX® 135A exposure unit (Polyfibron Technologies, Inc.) is a single source light of actinic radiation. Preferably, the light is a single source ultraviolet light of actinic radiation having a wavelength of about 250 nm to about 400 nm, more preferably of about 300 nm to about 400 nm, most preferably about 320 nm to about 380 nm. The exposure time should be sufficient to cure the photocurable layer of the photocurable element, such as from about 0.5 minutes to greater than about 30 minutes, depending on the light intensity. The light intensity can range from about 5.0 mW/cm$^2$ to about 30 mW/cm$^2$. For example, the light can be a single source 5 kW metal halide UV lamp type 1250 (Olec Corporation) at 7.5 mW/cm$^2$ of actinic UV radiation in the 300 nm to 400 nm range.

A relief image is formed on the plate by the single source actinic radiation 11 which passes through the glass plate 8 and the transparent areas of the image bearing negative 7.

Thereafter, the image bearing negative 7 and glass plate 8 are removed. The photocurable element can be washed in the same manner as described above. For example, the photocurable element can be washed with a solvent system and brushing action, which solvates and removes the slip film 4 (if a slip film is used) and the uncured areas of the photocurable layer 3, which leaves behind the cured polymer as the surface of the relief printing plate, as shown in FIG. 6.

EXAMPLES

The following examples are illustrative only and are not intended to limit the scope of the invention.

EXAMPLE 1

A SPLASH® brand flexographic printing plate (Polyfibron Technologies, Inc.) having a thickness of 0.025 inches was placed on a heated granite platen of the LETTERFLEX® 135A exposure system (Polyfibron Technologies, Inc.), and the cover film was removed. The granite platen was heated to about 48.9° C. The image bearing negative was mounted on a glass plate which was lowered over the printing plate, where the gap was set at a width of about 0.0010 inches between the printing plate and the image bearing negative. The printing plate was exposed to a single 5 kW light source for 2.5 minutes at 7.4 mW/cm$^2$. The 5 kW lamp has a dual peak in the 320 to 440 nm range, where the main peak is at 365 nm and the second peak is at 410 nm. The test target is 65 lines per inch (lpi) with a minimum highlight dot size of 2% or 2.15 mils in diameter, up to an 85% shadow. The negative also includes various fonts and font sizes from 4 point to 48 point and rule lines that taper from a maximum of 14 mils to a minimum of 1 mil.

After exposure, a latent image could be seen. The sample was etched in a National Processing unit (commercially available from National Machine Co., Mansfield, Ohio) three times at 13 inches/minute. After each etch pass, the plate was inspected. At this exposure, the plate showed a well-defined image, with shoulders perpendicular to the substrate (i.e., the dots looked like telephone poles with pointed tops). The printed dots had pointed tips. The highlight dots were missing and fine rule lines were wavy. In flexographic printing, the shoulder of the dot is the portion of the dot about 3 mils below the printing surface of the floor (see, for example, FIG. 4). Highlight dots have dot areas below 33%. In this example, the dot from the corresponding negative openings of less than 10 mils were either not formed during exposure due to being underexposed and/or they did not survive the developing or wash out of the plate.

EXAMPLE 2

A SPLASH® brand flexographic printing plate (Polyfibron Technologies, Inc.) having a thickness of 0.025 inches was placed on a heated granite platen of the LETTERFLEX® 135A exposure system (Polyfibron Technologies, Inc.), and the cover film was removed. The image bearing negative was placed on the glass plate, and the glass plate was placed in direct contact with the printing plate. The exposure time was five minutes with a single 5 kW light source at 7.4 mW/cm$^2$. The exposure negative was an ANPA test target which contains four individual lines screens of 65, 72, 100 and 120 lines per inch (lpi). The 65 lpi minimum dot size has a 3.0 mil diameter or a 3% highlight dot area up to a 94% shadow dot. The 72 lpi dot size has a 2.6 mil diameter or a 3% highlight dot area up to a 94% shadow dot. The 100 lpi minimum dot size has a 2.0 mil diameter or a 3% highlight dot area up to a 94% shadow dot. The 120 lpi minimum dot size has a 1.7 mil diameter or a 3% highlight dot area up to a 94% shadow dot. The negative also includes various fonts and font sizes from 4 point to 48 point.

After exposure, a latent image could be seen. Areas of poor contact were apparent. The processing time was 2 inches/minutes. After wash processing, the poor contact areas were noticeable as glossy areas, versus the matte areas on the plate. The image had shoulders perpendicular to the substrate; however, the dots had flat tips. Highlight dots were star-shaped up to step 3 on the lower line screens. In this example, the dot from the corresponding negative openings of less than 10 mils were formed during exposure; however, due to the lack of a supportive base, the dots had fallen over. When four dots fall onto each other, their tips join together and form a star. This starring was evident up to the 8% dot area or 5 mil dot at 65 lpi and 11% dot area or 5 mil dot at 72 lpi.

EXAMPLE 3

A SPLASH® brand flexographic printing plate (Polyfibron Technologies, Inc.) having a thickness of 0.025 inches was placed on a heated granite platen of the LETTERFLEX® 135A exposure system (Polyfibron Technologies, Inc.), and the cover film was removed. The image bearing negative was mounted on the glass plate. The glass plate was lowered over the plate, where the gap was set at a width of about 0.0010 inches between the plate and the image bearing negative (i.e., an ANPA test target negative), and the plate was exposed for 10 minutes at 7.4 mW/cm$^2$. After exposure, a latent image could be seen. The sample was etched in a National Processing unit (commercially available from National Machine Co., Mansfield, Ohio) three times at 2 inches/minute. Highlight dots were held on 3 to step 2 and some slight shoulder was seen. The printed dots had pointed tips. Deep reverses were observed and the reverses were more open than those exposed to multi-light actinic radiation. Only the 3% highlight dots did not remain after the wash out process. The dots that were on the plate had taken on a conic shape as opposed to the telephone pole or conic shape described above. Deeper reverses translates into a sharper or cleaner image. The deeper reverses of the plates provide a clearer, sharper printing image.

EXAMPLE 4

A SPLASH® brand flexographic printing plate (Polyfibron Technologies, Inc.) having a thickness of 0.025 inches was placed on a heated granite platen of the LETTERFLEX® 135A exposure system (Polyfibron Technologies, Inc.), and the cover film was removed. An ANPA negative was laid on the SPLASH® plate. 0.0002 inch polyester was used as a creen and vacuum was pulled on the creen to maximize the contact between the plate and the negative. The plate was exposed for 10 minutes to a single light source at 7.4 mW/cm$^2$ and processed as described in Example 2. The dots had flat tops. The reverses were more open than those exposed to multi-light actinic radiation. The dots looked like cones with flat tops. The reverses were deeper, which translates into a sharper or cleaner plate image. The deeper reverses of the plates provides a clearer, sharper printing image. This example is not as good as the method of the invention due to the flat top of the dots. In this example, the dots printed with greater dot gain than the method of the invention.

EXAMPLE 5

A comparison of 3 different printing plates was made using NEWSFLEX® LD60 (a liquid newspaper off-contact printing plate, commercially available from Polyfibron Technologies, Inc.), a SPLASH® brand flexographic printing plate (Polyfibron Technologies, Inc.) used in a direct contact method, and a SPLASH® brand flexographic printing plate (Polyfibron Technologies, Inc.) used in an off-contact printing method of the present invention.

For the production of a NEWSFLEX® LD60 plate using a LETTERFLEX® 135A processing system, an image bearing negative was mounted on the glass plate. The image bearing negative was an ANPA test target. A 0.0007 inch steel substrate was vacuum mounted onto the heated granite platen. About 0.0015 inches of the liquid NEWSFLEX® LD60 polymer was coated onto the steel substrate using a doctor blade. The liquid polymer was given a pre-exposure (also known as a bump exposure) using a low intensity ultraviolet actinic light source. The pre-exposure intensity range for liquid NEWSFLEX® LD60 was about 0.40 mW/cm$^2$±0.05 mW/cm$^2$ at a pre-exposure speed of about 1 inch per second. The glass plate with the image bearing negative was lowered over the liquid NEWSFLEX® LD60 plate, providing a gap of about 0.0014 inches between the image bearing negative and the liquid NEWSFLEX® LD60 plate.

Using the single light source 5 kW Oleic lamp at 7.5 mW/cm$^2$, the liquid NEWSFLEX® LD60 polymer was exposed for 40 seconds. The exposure conditions for the NEWSFLEX® LD60 were that, with a 40 second±5 second exposure at 6.5 to 8.5 mW/cm$^2$, the polymer held a 3% dot on a 65, 85 and 100 lpi line screen.

After exposure of the liquid polymer, the glass plate was lifted off the plate. The un-cured resin was removed from the plate with an air knife. The plate was then etched in a surfactant solution to remove any residual polymer. After plate washing the plate was given a final post exposure, which completed the curing process.

The method for direct contact imaging a SPLASH® printing plate is shown in FIG. 3, except that no back exposure was used. The protective cover film was removed, and an image bearing negative was placed in direct contact with the slip film. A vacuum was applied to insure intimate contact between the image bearing negative and the slip film. Imaging of the printing area was achieved by exposing the photocurable layer of the photocurable element with multi-source actinic radiation through the transparent regions of the image bearing negative for 6 minutes to cure the photocurable layer to hold the 3% dots on the 65, 85 and 100 lpi line screen.

Thereafter, the image bearing negative was removed from the slip film, and the printing element was washed with a solvent system and brushing action, which solvated and removed the slip film and the uncured areas of the photocurable layer, leaving behind the cured polymer as the surface of the relief printing plate, as shown in FIG. 4. This imaging technique produced a relief printing plate that had conic shaped dots with a flat surface to the dot.

A SPLASH® brand printing plate was used in the off-contact printing method of the present invention. A SPLASH® brand printing plate having a thickness of 0.025 inches was vacuum mounted onto the granite platen of the LETTERFLEX® 135A exposure system, and the cover film was removed. The image bearing negative was vacuum mounted on a glass plate. The glass plate was lowered over the plate, where the gap was set at a width of about 0.0024 inches between the plate and the image bearing negative (i.e., an ANPA test target), and the plate was exposed to a single source light for 22 minutes at 7.4 mW/cm$^2$. This was the minimum exposure time required to hold the 3% highlight dots.

In the SPLASH® plates used in the direct contact method, the plates printed with heavier, bolder type and considerably darker tones in all screen counts (i.e., 65, 85 and 100 lpi line screens). Reverse type also closed in, which means that the printed detail was lost and the reverse text was unreadable. When compared to the standard liquid polymer NEWSFLEX® LD60, printed tone curves show that the SPLASH® plates made by the direct contact method printed with 15–25% more dot gain in the highlight, with 17–21% more dot gain in the mid-tones and with 13–18% more dot gain in the shadows.

In the SPLASH® plates used in the off-contact method of the present invention, the plates printed considerably cleaner, sharper and with less dot gain than the SPLASH® plates printed by the direct contact method. The printed tone curves of the off-contact printed SPLASH® plates show that dot gain in all line screens was no more than 11%. When compared to the standard liquid polymer NEWSFLEX® LD60, the SPLASH® plates made by the method of the present invention printed with only 5–9% more dot gain in the highlights, with only 8–11% more dot gain in the midtones and with only 8–10% more dot gain in the shadows.

EXAMPLE 6

To shorten exposure time, triphenylphosphine was added to the ATLAS® plate in an amount of 2.5%, based on the amount of resin in the photocurable element. The back exposure, creating the floor, for a 067 mil plate was shortened from 20 seconds to 5 seconds, and the off-contact face exposure was reduced from greater than 4 hours to 5 minutes.

The phosphine compound was added directly to the rubber. The rubber and the photoactive diluents, along with the stabilizers, monomers, plasticizers, photoinitiators and triphenylphosphine were added to a SIGMA mixer. The materials were mixed at 250° F. until the rubber compound and all the ingredients of the formulation fused together.

In commercial flexographic printing, the image is anchored onto the floor. The floor is established by back exposure. In flexographic printing, a floor is typically about 35 mils on a plate that is 67 mils thick. Optimum back exposure times are determined by conducting a time incremental step exposure through the plate backing. After the plate is given various back exposures, the plate is washed to remove the uncured surface polymer, revealing the cured floor. The optimum time to provide a 35 mil floor in the case of the 67 mil plate is then determined. In the case of ATLAS®, without triphenylphosphine, a typical back exposure is 20 seconds. With the addition of triphenylphosphine at 2.5%, the back exposure is 5 seconds.

EXAMPLE 7

2.5% triphenylphosphine was compounded into two ATLAS® printing plates (Polyfibron Technologies, Inc.) having a thickness of 067 mil. The printing plates were placed in a LETTERFLEX® 135A exposure system (Polyfibron Technologies, Inc.). No slip film was used in the printing plates in order to prevent any image distortion caused by light scattering through the slip film.

Using the direct contact method, plate #1 was given a back exposure of 8 seconds using bank lights (e.g., multi-source light) and a face exposure of 100 seconds using a single UV light at an intensity of 7.21 mW/cm$^2$. The plate was washed in solvent for 6 minutes. Highlight dot starring was seen up through step 12. The results show that the exposure time of 100 seconds was not long enough to prevent the highlight dots (e.g., dots below 33% area) from falling over. The results are shown in FIG. 7A.

Using the off-contact method of the present invention, plate #2 was given a back exposure of 8 seconds using bank lights and a face exposure of 300 seconds using a single UV light at an intensity of 7.21 mW/cm$^2$. The gap was 0.0016 inches. The plate was washed in solvent for 5 minutes. The highlight dots held down to step 2. The results of this test show that the minimum holding time required to hold a 3%, 65 line per inch dot is 300 seconds. The results are better than those of test plate 1 because, among other things, a minimum holding time was established. The results are shown in FIG. 7B.

Figure 7A:
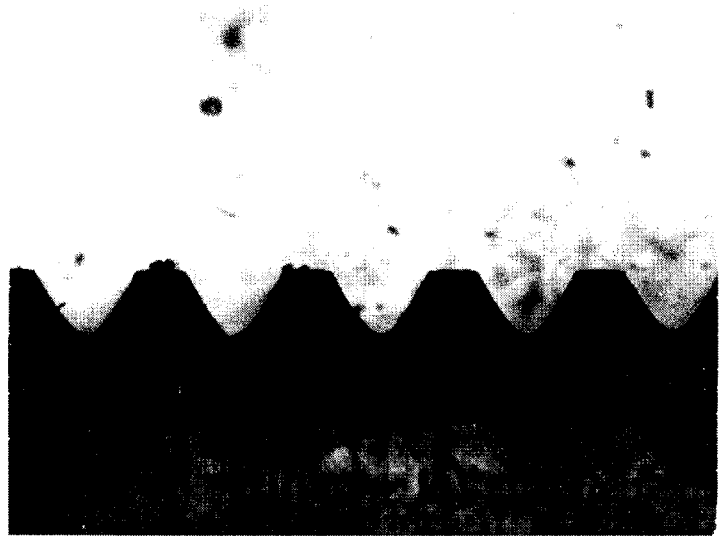
FIG. 7A is a micrograph of a cross-section of a printing plate produced by a direct contact method.
Figure 7B:
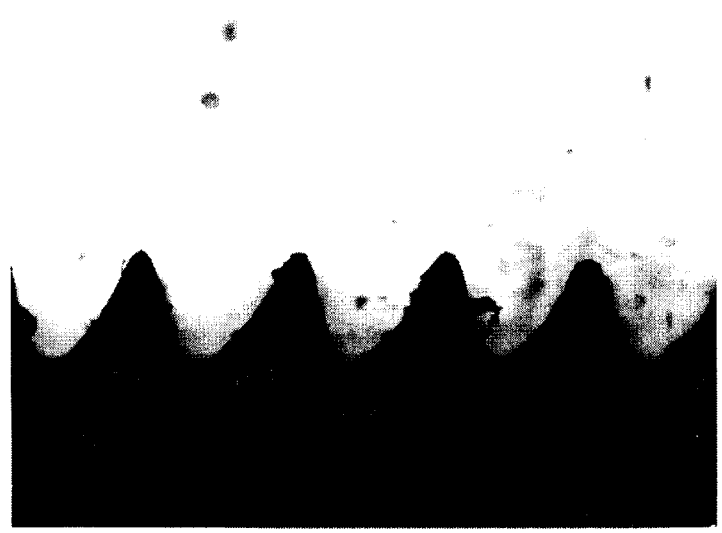
FIG. 7B is a micrograph of a cross-section of a printing plate produced by the off-contact method of the present invention.

The cross-section dot profile micrographs of FIGS. 7A and 7B show the comparison of conventional contact imaging to an off-contact imaged 65 lpi 3% highlight dot. As can be seen in FIG. 7A, a conventionally imaged plate (i.e., direct contact) has a conic shaped dot with a flat top or printing surface. As can be seen in FIG. 7B, the off-contact imaged plate of the present invention shows the conic shape with a pointed dot top or printing surface. The pointed dot structure relates to a significant reduction in printed dot gain when compared to the flat top structure of the direct contact method.

One skilled in the art will appreciate that numerous changes and modifications can be made to the preferred embodiments of the invention and that such changes and modifications can be made without departing from the spirit of the invention. It is intended that the appended claims cover all such equivalent variations as fall within the spirit and scope of the invention.

What is claimed is:

1. A method for reducing the printed dot gain of a solid relief printing element comprising:

providing a solid photocurable element having a photocurable layer comprising a solid photocurable polymer;

positioning an image bearing transparency directly adjacent but at a fixed distance from the photocurable layer, thereby defining a gap; and exposing the photocurable layer in the solid photocurable element to a single source of actinic radiation through the image bearing transparency.

2. The method of claim 1 wherein the gap is about 0.0005 inches to about 0.0025 inches.

3. The method of claim 2 wherein the gap is about 0.0010 inches to about 0.0020 inches.

4. The method of claim 3 wherein the gap is about 0.0014 inches.

5. The method of claim 1 wherein the actinic radiation has a wavelength of from about 250 nm to about 450 nm.

6. The method of claim 1 wherein the solid photocurable layer further comprises an oxygen scavenger.

7. The method of claim 6 wherein the oxygen scavenger is a phosphine compound.

8. The method of claim 7 wherein the phosphine compound is selected from the group consisting of triphenylphosphine, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, diallyl-p-methoxyphenylphosphine, diallyl-p-bromophenylphosphine and diallyl-p-tolylphosphine.

9. The method of claim 1 wherein said positioning step includes mounting the image bearing transparency to a substantially transparent support.

10. The method of claim 9 wherein the substantially transparent support is a glass plate.

11. The method of claim 8 wherein the phosphine compound is triphenylphosphine.

12. A method for reducing the printed dot gain of a solid relief printing element comprising:

providing a solid photocurable element having a photocurable polymeric layer, the photocurable layer having opposing first and second planar faces, said faces being substantially parallel to each other;

exposing the first face of the photocurable layer to multi-source actinic radiation;

positioning an image-bearing transparency directly adjacent but at a fixed distance from the second face of the photocurable layer, thereby defining a gap; and exposing the second face of the solid photocurable layer to a single source of actinic radiation through the image bearing transparency.

13. The method of claim 12 wherein the gap is about 0.0005 inches to about 0.0025 inches.

14. The method of claim 13 wherein the gap is about 0.0010 inches to about 0.0020 inches.

15. The method of claim 12 wherein the single source actinic radiation has a wavelength of from about 250 nm to about 450 nm.

16. The method of claim 12 wherein the solid photocurable layer comprises an oxygen scavenger.

17. The method of claim 16 wherein the oxygen scavenger is a phosphine compound.

18. The method of claim 17 wherein the phosphine compound is selected from the group consisting of triphenylphosphine, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, diallyl-p-methoxyphenylphosphine, diallyl-p-bromophenylphosphine and diallyl-p-tolylphosphine.

19. The method of claim 18, wherein the phosphine compound is triphenylphosphine.

20. The method of claim 12 wherein said positioning step includes mounting the image bearing transparency to a substantially transparent support.

21. The method of claim 20 wherein the substantially transparent support is a glass plate.

22. The method of claim 17 wherein the phosphine compound is present in the photocurable layer at from about 0.5 to about 2.5 weight percent.

23. The method of claim 17 wherein the phosphine compound is present in the photocurable layer at from about 0.2 to about 3.0 weight percent.

\* \* \* \* \*